United States Patent
Ritenour

(10) Patent No.: US 9,147,632 B2
(45) Date of Patent: Sep. 29, 2015

(54) SEMICONDUCTOR DEVICE HAVING IMPROVED HEAT DISSIPATION

(71) Applicant: RF Micro Devices, Inc., Greensboro, NC (US)

(72) Inventor: Andrew P. Ritenour, Colfax, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/974,488

(22) Filed: Aug. 23, 2013

(65) Prior Publication Data

US 2014/0054604 A1 Feb. 27, 2014

Related U.S. Application Data

(60) Provisional application No. 61/693,076, filed on Aug. 24, 2012.

(51) Int. Cl.
| | |
|---|---|
| *H01L 23/34* | (2006.01) |
| *H01L 29/66* | (2006.01) |
| *H01L 29/20* | (2006.01) |

(Continued)

(52) U.S. Cl.
CPC ............ *H01L 23/34* (2013.01); *H01L 23/3677* (2013.01); *H01L 23/4824* (2013.01); *H01L 29/2003* (2013.01); *H01L 29/66431* (2013.01); *H01L 29/7786* (2013.01); *H01L 29/0657* (2013.01); *H01L 29/0696* (2013.01); *H01L 2924/0002* (2013.01)

(58) Field of Classification Search
CPC .............. H01L 23/34; H01L 29/66431; H01L 29/2003

USPC ...................................... 257/76, 774; 438/172
See application file for complete search history.

(56) References Cited

U.S. PATENT DOCUMENTS

| | | |
|---|---|---|
| 4,317,055 A | 2/1982 | Yoshida et al. |
| 4,540,954 A | 9/1985 | Apel |

(Continued)

FOREIGN PATENT DOCUMENTS

| | | |
|---|---|---|
| EP | 1187229 A1 | 3/2002 |
| EP | 1826041 A1 | 8/2007 |

(Continued)

OTHER PUBLICATIONS

International Search Report and Written Opinion for PCT/US2013/056105, mailed Feb. 12, 2014, 15 pages.

(Continued)

*Primary Examiner* — Karen Kusumakar
*Assistant Examiner* — Adam S Bowen
(74) *Attorney, Agent, or Firm* — Withrow & Terranova, P.L.L.C.

(57) ABSTRACT

A semiconductor device having improved heat dissipation is disclosed. The semiconductor device includes a semi-insulating substrate and epitaxial layers disposed on the semi-insulating substrate wherein the epitaxial layers include a plurality of heat conductive vias that are disposed through the epitaxial layers with the plurality of heat conductive vias being spaced along a plurality of finger axes that are aligned generally parallel across a surface of the epitaxial layers. The semiconductor device further includes an electrode having a plurality of electrically conductive fingers that are disposed along the plurality of finger axes such that the electrically conductive fingers are in contact with the first plurality of heat conductive vias.

10 Claims, 6 Drawing Sheets

(51) Int. Cl.
*H01L 29/778* (2006.01)
*H01L 23/367* (2006.01)
*H01L 23/482* (2006.01)
*H01L 29/06* (2006.01)

(56) References Cited

U.S. PATENT DOCUMENTS

| | | | |
|---|---|---|---|
| 4,543,535 A | 9/1985 | Ayasli | |
| 4,620,207 A | 10/1986 | Calviello | |
| 4,788,511 A | 11/1988 | Schindler | |
| 5,028,879 A | 7/1991 | Kim | |
| 5,046,155 A | 9/1991 | Beyer et al. | |
| 5,047,355 A | 9/1991 | Huber et al. | |
| 5,107,323 A | 4/1992 | Knolle et al. | |
| 5,118,993 A | 6/1992 | Yang | |
| 5,208,547 A | 5/1993 | Schindler | |
| 5,227,734 A | 7/1993 | Schindler et al. | |
| 5,306,656 A | 4/1994 | Williams et al. | |
| 5,361,038 A | 11/1994 | Allen et al. | |
| 5,365,197 A | 11/1994 | Ikalainen | |
| 5,389,571 A | 2/1995 | Takeuchi et al. | |
| 5,414,387 A | 5/1995 | Nakahara et al. | |
| 5,485,118 A | 1/1996 | Chick | |
| 5,608,353 A | 3/1997 | Pratt | |
| 5,629,648 A | 5/1997 | Pratt | |
| 5,698,870 A | 12/1997 | Nakano et al. | |
| 5,742,205 A | 4/1998 | Cowen et al. | |
| 5,764,673 A | 6/1998 | Kawazu et al. | |
| 5,834,326 A | 11/1998 | Miyachi et al. | |
| 5,843,590 A | 12/1998 | Miura et al. | |
| 5,864,156 A | 1/1999 | Juengling | |
| 5,874,747 A | 2/1999 | Redwing et al. | |
| 5,880,640 A | 3/1999 | Dueme | |
| 5,914,501 A | 6/1999 | Antle et al. | |
| 5,949,140 A | 9/1999 | Nishi et al. | |
| 6,049,250 A | 4/2000 | Kintis et al. | |
| 6,064,082 A | 5/2000 | Kawai et al. | |
| 6,110,757 A | 8/2000 | Udagawa et al. | |
| 6,130,579 A | 10/2000 | Iyer et al. | |
| 6,133,589 A | 10/2000 | Krames et al. | |
| 6,177,685 B1 | 1/2001 | Teraguchi et al. | |
| 6,191,656 B1 | 2/2001 | Nadler | |
| 6,229,395 B1 | 5/2001 | Kay | |
| 6,265,943 B1 | 7/2001 | Dening et al. | |
| 6,271,727 B1 | 8/2001 | Schmukler | |
| 6,285,239 B1 | 9/2001 | Iyer et al. | |
| 6,306,709 B1 | 10/2001 | Miyagi et al. | |
| 6,307,364 B1 | 10/2001 | Augustine | |
| 6,313,705 B1 | 11/2001 | Dening et al. | |
| 6,329,809 B1 | 12/2001 | Dening et al. | |
| 6,333,677 B1 | 12/2001 | Dening | |
| 6,342,815 B1 | 1/2002 | Kobayashi | |
| 6,356,150 B1 | 3/2002 | Spears et al. | |
| 6,369,656 B2 | 4/2002 | Dening et al. | |
| 6,369,657 B2 | 4/2002 | Dening et al. | |
| 6,373,318 B1 | 4/2002 | Dohnke et al. | |
| 6,376,864 B1 | 4/2002 | Wang | |
| 6,377,125 B1 | 4/2002 | Pavio et al. | |
| 6,384,433 B1 | 5/2002 | Barratt et al. | |
| 6,387,733 B1 | 5/2002 | Holyoak et al. | |
| 6,392,487 B1 | 5/2002 | Alexanian | |
| 6,400,226 B2 | 6/2002 | Sato | |
| 6,404,287 B2 | 6/2002 | Dening et al. | |
| 6,448,793 B1 | 9/2002 | Barratt et al. | |
| 6,455,877 B1 | 9/2002 | Ogawa et al. | |
| 6,475,916 B1 | 11/2002 | Lee et al. | |
| 6,477,682 B2 | 11/2002 | Cypher | |
| 6,521,998 B1 | 2/2003 | Teraguchi et al. | |
| 6,525,611 B1 | 2/2003 | Dening et al. | |
| 6,528,983 B1 | 3/2003 | Augustine | |
| 6,560,452 B1 | 5/2003 | Shealy | |
| 6,566,963 B1 | 5/2003 | Yan et al. | |
| 6,589,877 B1 | 7/2003 | Thakur | |
| 6,593,597 B2 | 7/2003 | Sheu | |
| 6,608,367 B1 | 8/2003 | Gibson et al. | |
| 6,614,281 B1 | 9/2003 | Baudelot et al. | |
| 6,621,140 B1 | 9/2003 | Gibson et al. | |
| 6,624,452 B2 | 9/2003 | Yu et al. | |
| 6,627,552 B1 | 9/2003 | Nishio et al. | |
| 6,633,073 B2 | 10/2003 | Rezvani et al. | |
| 6,633,195 B2 | 10/2003 | Baudelot et al. | |
| 6,639,470 B1 | 10/2003 | Andrys et al. | |
| 6,656,271 B2 | 12/2003 | Yonehara et al. | |
| 6,657,592 B2 | 12/2003 | Dening et al. | |
| 6,660,606 B2 | 12/2003 | Miyabayashi et al. | |
| 6,701,134 B1 | 3/2004 | Epperson | |
| 6,701,138 B2 | 3/2004 | Epperson et al. | |
| 6,706,576 B1 | 3/2004 | Ngo et al. | |
| 6,720,831 B2 | 4/2004 | Dening et al. | |
| 6,723,587 B2 | 4/2004 | Cho et al. | |
| 6,724,252 B2 | 4/2004 | Ngo et al. | |
| 6,727,762 B1 | 4/2004 | Kobayashi | |
| 6,748,204 B1 | 6/2004 | Razavi et al. | |
| 6,750,158 B2 | 6/2004 | Ogawa et al. | |
| 6,750,482 B2 | 6/2004 | Seaford et al. | |
| 6,759,907 B2 | 7/2004 | Orr et al. | |
| 6,802,902 B2 | 10/2004 | Beaumont et al. | |
| 6,815,722 B2 | 11/2004 | Lai et al. | |
| 6,815,730 B2 | 11/2004 | Yamada | |
| 6,822,842 B2 | 11/2004 | Friedrichs et al. | |
| 6,861,677 B2 | 3/2005 | Chen | |
| 6,943,631 B2 | 9/2005 | Scherrer et al. | |
| 7,015,512 B2 | 3/2006 | Park et al. | |
| 7,026,665 B1 | 4/2006 | Smart et al. | |
| 7,033,961 B1 | 4/2006 | Smart et al. | |
| 7,042,150 B2 | 5/2006 | Yasuda | |
| 7,052,942 B1 | 5/2006 | Smart et al. | |
| 7,211,822 B2 | 5/2007 | Nagahama et al. | |
| 7,408,182 B1 | 8/2008 | Smart et al. | |
| 7,449,762 B1 | 11/2008 | Singh | |
| 7,459,356 B1 | 12/2008 | Smart et al. | |
| 7,557,421 B1 | 7/2009 | Shealy et al. | |
| 7,719,055 B1 | 5/2010 | McNutt et al. | |
| 7,768,758 B2 | 8/2010 | Maier et al. | |
| 7,804,262 B2 | 9/2010 | Schuster et al. | |
| 7,935,983 B2 | 5/2011 | Saito et al. | |
| 7,968,391 B1 | 6/2011 | Smart et al. | |
| 7,974,322 B2 | 7/2011 | Ueda et al. | |
| 8,017,981 B2 | 9/2011 | Sankin et al. | |
| 8,405,068 B2 | 3/2013 | O'Keefe | |
| 8,502,258 B2 | 8/2013 | O'Keefe | |
| 8,633,518 B2 | 1/2014 | Suh et al. | |
| 8,692,294 B2 | 4/2014 | Chu et al. | |
| 8,785,976 B2 | 7/2014 | Nakajima et al. | |
| 2001/0040246 A1 | 11/2001 | Ishii | |
| 2001/0054848 A1 | 12/2001 | Baudelot et al. | |
| 2002/0031851 A1 | 3/2002 | Linthicum et al. | |
| 2002/0048302 A1 | 4/2002 | Kimura | |
| 2002/0079508 A1 | 6/2002 | Yoshida | |
| 2003/0003630 A1 | 1/2003 | Iimura et al. | |
| 2003/0122139 A1 | 7/2003 | Meng et al. | |
| 2003/0160307 A1 | 8/2003 | Gibson et al. | |
| 2003/0160317 A1 | 8/2003 | Sakamoto et al. | |
| 2003/0206440 A1 | 11/2003 | Wong | |
| 2003/0209730 A1 | 11/2003 | Gibson et al. | |
| 2003/0218183 A1 | 11/2003 | Micovic et al. | |
| 2004/0070003 A1 | 4/2004 | Gaska et al. | |
| 2004/0130037 A1 | 7/2004 | Mishra et al. | |
| 2004/0241916 A1 | 12/2004 | Chau et al. | |
| 2005/0139868 A1 | 6/2005 | Anda | |
| 2005/0189559 A1 | 9/2005 | Saito et al. | |
| 2005/0189562 A1 | 9/2005 | Kinzer et al. | |
| 2005/0194612 A1 | 9/2005 | Beach | |
| 2005/0212049 A1 | 9/2005 | Onodera | |
| 2005/0225912 A1 | 10/2005 | Pant et al. | |
| 2005/0271107 A1 | 12/2005 | Murakami et al. | |
| 2006/0043385 A1 | 3/2006 | Wang et al. | |
| 2006/0068601 A1 | 3/2006 | Lee et al. | |
| 2006/0124960 A1 | 6/2006 | Hirose et al. | |
| 2006/0243988 A1 | 11/2006 | Narukawa et al. | |
| 2007/0093009 A1 | 4/2007 | Baptist et al. | |
| 2007/0295985 A1 | 12/2007 | Weeks, Jr. et al. | |
| 2008/0023706 A1 | 1/2008 | Saito et al. | |
| 2008/0073752 A1 | 3/2008 | Asai et al. | |

(56) References Cited

U.S. PATENT DOCUMENTS

| | | | |
|---|---|---|---|
| 2008/0112448 A1 | 5/2008 | Ueda et al. | |
| 2008/0121875 A1 | 5/2008 | Kim | |
| 2008/0142837 A1* | 6/2008 | Sato et al. | 257/190 |
| 2008/0179737 A1 | 7/2008 | Haga et al. | |
| 2008/0190355 A1* | 8/2008 | Chen et al. | 117/3 |
| 2008/0272382 A1 | 11/2008 | Kim et al. | |
| 2008/0272422 A1 | 11/2008 | Min | |
| 2008/0283821 A1 | 11/2008 | Park et al. | |
| 2008/0308813 A1 | 12/2008 | Suh et al. | |
| 2009/0072269 A1 | 3/2009 | Suh et al. | |
| 2009/0090984 A1 | 4/2009 | Khan et al. | |
| 2009/0146185 A1 | 6/2009 | Suh et al. | |
| 2009/0146186 A1 | 6/2009 | Kub et al. | |
| 2009/0166677 A1 | 7/2009 | Shibata et al. | |
| 2009/0278137 A1 | 11/2009 | Sheridan et al. | |
| 2010/0025657 A1 | 2/2010 | Nagahama et al. | |
| 2010/0133567 A1 | 6/2010 | Son | |
| 2010/0187575 A1 | 7/2010 | Baumgartner et al. | |
| 2010/0207164 A1 | 8/2010 | Shibata et al. | |
| 2010/0230656 A1 | 9/2010 | O'Keefe | |
| 2010/0230717 A1 | 9/2010 | Saito | |
| 2010/0258898 A1 | 10/2010 | Lahreche | |
| 2011/0017972 A1 | 1/2011 | O'Keefe | |
| 2011/0025422 A1 | 2/2011 | Marra et al. | |
| 2011/0095337 A1 | 4/2011 | Sato | |
| 2011/0101300 A1 | 5/2011 | O'Keefe | |
| 2011/0115025 A1* | 5/2011 | Okamoto | 257/368 |
| 2011/0127586 A1 | 6/2011 | Bobde et al. | |
| 2011/0163342 A1 | 7/2011 | Kim et al. | |
| 2011/0175142 A1 | 7/2011 | Tsurumi et al. | |
| 2011/0199148 A1 | 8/2011 | Iwamura | |
| 2011/0211289 A1 | 9/2011 | Kosowsky et al. | |
| 2011/0242921 A1 | 10/2011 | Tran et al. | |
| 2011/0290174 A1* | 12/2011 | Leonard et al. | 117/84 |
| 2012/0018735 A1 | 1/2012 | Ishii | |
| 2012/0086497 A1* | 4/2012 | Vorhaus | 327/427 |
| 2012/0126240 A1 | 5/2012 | Won | |
| 2012/0199875 A1 | 8/2012 | Bhalla et al. | |
| 2012/0211802 A1 | 8/2012 | Tamari | |
| 2012/0218783 A1 | 8/2012 | Imada | |
| 2012/0262220 A1 | 10/2012 | Springett | |
| 2013/0277687 A1 | 10/2013 | Kobayashi et al. | |
| 2013/0280877 A1 | 10/2013 | Kobayashi et al. | |

FOREIGN PATENT DOCUMENTS

| | | | |
|---|---|---|---|
| JP | 10242584 A | 9/1998 | |
| JP | 2000031535 A | 1/2000 | |
| JP | 2003332618 A | 11/2003 | |
| JP | 2008148511 A | 6/2008 | |
| JP | 2008258419 A | 10/2008 | |
| KR | 20070066051 A | 6/2007 | |
| WO | 2004051707 A3 | 6/2004 | |
| WO | 2011162243 A1 | 12/2011 | |

OTHER PUBLICATIONS

Non-Final Office Action for U.S. Appl. No. 13/927,182, mailed May 1, 2014, 7 pages.

Non-Final Office Action for U.S. Appl. No. 13/973,482, mailed May 23, 2014, 8 pages.

Non-Final Office Action for U.S. Appl. No. 13/795,986, mailed Apr. 24, 2014, 13 pages.

Chang, S.J. et al., "Improved ESD protection by combining InGaN—GaN MQW LEDs with GaN Schottky diodes," IEEE Electron Device Letters, Mar. 2003, vol. 24, No. 3, pp. 129-131.

Chao, C-H., et al., "Theoretical demonstration of enhancement of light extraction of flip-chip GaN light-emitting diodes with photonic crystals," Applied Physics Letters, vol. 89, 2006, 4 pages.

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.

Hibbard, D.L. et al., "Low Resistance High Reflectance Contacts to p-GaN Using Oxidized Ni/Au and Al or Ag," Applied Physics Letters, vol. 83 No. 2, Jul. 14, 2003, pp. 311-313.

Lee, S.J., "Study of photon extraction efficiency in InGaN light-emitting diodes depending on chip structures and chip-mount schemes," Optical Engineering, SPIE, Jan. 2006, vol. 45, No. 1, 14 pages.

Shchekin, O.B. et al., "High performance thin-film flip-chip InGaN—GaN light-emitting diodes," Applied Physics Letters, vol. 89, 071109, Aug. 2006, 4 pages.

Wierer, J. et al., "High-power AlGaInN flip-chip light-emitting diodes," Applied Physics Letters, vol. 78 No. 22, May 28, 2001, pp. 3379-3381.

Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

Windisch, R. et al., "Impact of texture-enhanced transmission on high-efficiency surface-textured light-emitting diodes," Applied Physics Letters, Oct. 8, 2001, vol. 79, No. 15, pp. 2315-2317.

Advisory Action for U.S. Appl. No. 10/620,205, mailed Feb. 15, 2005, 2 pages.

Final Office Action for U.S. Appl. No. 10/620,205, mailed Dec. 16, 2004, 9 pages.

Non-Final Office Action for U.S. Appl. No. 10/620,205, mailed Jul. 23, 2004, 7 pages.

Non-Final Office Action for U.S. Appl. No. 10/620,205, mailed May 3, 2005, 10 pages.

Notice of Allowance for U.S. Appl. No. 10/620,205, mailed Dec. 8, 2005, 4 pages.

Non-Final Office Action for U.S. Appl. No. 10/689,980, mailed Jan. 26, 2005, 7 pages.

Non-Final Office Action for U.S. Appl. No. 10/689,980, mailed May 12, 2005, 8 pages.

Non-Final Office Action for U.S. Appl. No. 12/841,225 mailed Dec. 22, 2011, 8 pages.

Non-Final Office Action for U.S. Appl. No. 11/397,279, mailed Oct. 31, 2007, 7 pages.

Notice of Allowance for U.S. Appl. No. 11/397,279, mailed Apr. 17, 2008, 7 pages.

Final Office Action for U.S. Appl. No. 10/689,979, mailed Jun. 29, 2005, 16 pages.

Non-Final Office Action for U.S. Appl. No. 10/689,979, mailed Jan. 11, 2005, 14 pages.

Notice of Allowance for U.S. Appl. No. 10/689,979, mailed Oct. 26, 2005, 6 pages.

Notice of Allowance for U.S. Appl. No. 12/841,225, mailed Nov. 9, 2012, 5 pages.

Non-Final Office Action for U.S. Appl. No. 11/360,734, mailed Jan. 18, 2008, 10 pages.

Notice of Allowance for U.S. Appl. No. 11/360,734, mailed Aug. 7, 2008, 6 pages.

Non-Final Office Action for U.S. Appl. No. 12/841,257 mailed Jan. 5, 2012, 13 pages.

Advisory Action for U.S. Appl. No. 11/937,207, mailed Feb. 2, 2010, 2 pages.

Final Office Action for U.S. Appl. No. 11/937,207, mailed Nov. 19, 2009, 9 pages.

Non-Final Office Action for U.S. Appl. No. 11/937,207, mailed Mar. 18, 2010, 10 pages.

Non-Final Office Action for U.S. Appl. No. 11/937,207, mailed May 29, 2009, 11 pages.

Notice of Allowance for U.S. Appl. No. 11/937,207, mailed Feb. 28, 2011, 8 pages.

Quayle Action for U.S. Appl. No. 11/937,207, mailed Nov. 24, 2010, 4 pages.

Final Office Action for U.S. Appl. No. 11/458,833, mailed Dec. 15, 2008, 13 pages.

(56) References Cited

OTHER PUBLICATIONS

Non-Final Office Action for U.S. Appl. No. 11/458,833, mailed Apr. 1, 2008, 10 pages.
Notice of Allowance for U.S. Appl. No. 11/458,833, mailed Mar. 9, 2009, 7 pages.
Invitation to Pay Fees for PCT/US2013/056105, mailed Nov. 5, 2013, 7 pages.
International Search Report and Written Opinion for PCT/US2013/056126, mailed Oct. 25, 2013, 10 pages.
International Search Report and Written Opinion for PCT/US2013/056132, mailed Oct. 10, 2013, 11 pages.
International Search Report and Written Opinion for PCT/US2013/056187, mailed Oct. 10, 2013, 11 pages.
International Search Report for GB0902558.6, issued Jun. 15, 2010, by the UK Intellectual Property Office, 2 pages.
Examination Report for British Patent Application No. 0902558.6, mailed Nov. 16, 2012, 5 pages.
Examination Report for British Patent Application No. GB0902558.6, issued Feb. 28, 2013, 2 pages.
Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
Non-Final Office Action for U.S. Appl. No. 13/910,202, mailed Sep. 25, 2014, 9 pages.
Final Office Action for U.S. Appl. No. 13/927,182, mailed Sep. 17, 2014, 10 pages.
Non-Final Office Action for U.S. Appl. No. 13/966,400, mailed Sep. 3, 2014, 9 pages.
Non-Final Office Action for U.S. Appl. No. 13/957,698, mailed Nov. 5, 2014, 11 pages.
Final Office Action for U.S. Appl. No. 13/973,482, mailed Nov. 5, 2014, 9 pages.
International Preliminary Report on Patentability for PCT/US2013/056105, mailed Mar. 5, 2015, 12 pages.
International Preliminary Report on Patentability for PCT/US2013/056126, mailed Mar. 5, 2015, 7 pages.
International Preliminary Report on Patentability for PCT/US2013/056132, mailed Mar. 5, 2015, 9 pages.
International Preliminary Report on Patentability for PCT/US2013/056187, mailed Mar. 12, 2015, 9 pages.
Advisory Action for U.S. Appl. No. 13/910,202, mailed Apr. 6, 2015, 3 pages.
Notice of Allowance for U.S. Appl. No. 13/966,400, mailed Feb. 20, 2015, 8 pages.
Notice of Allowance for U.S. Appl. No. 13/957,698, mailed Mar. 30, 2015, 7 pages.
Notice of Allowance for U.S. Appl. No. 13/795,986, mailed Mar. 6, 2015, 8 pages.
Non-Final Office Action for U.S. Appl. No. 14/067,019, mailed Mar. 25, 2015, 7 pages.
Boutros, K.S., et al., "5W GaN MMIC for Millimeter-Wave Applications," 2006 Compound Semiconductor Integrated Circuit Symposium, Nov. 2006, pp. 93-95.
Cho, H., et al., "High Density Plasma Via Hole Etching in SiC," Journal of Vacuum Science & Technology A: Surfaces, and Films, vol. 19, No. 4, Jul./Aug. 2001, pp. 1878-1881.
Darwish, A.M., et al., "Dependence of GaN HEMT Millimeter-Wave Performance on Temperature," IEEE Transactions on Microwave Theory and Techniques, vol. 57, No. 12, Dec. 2009, pp. 3205-3211.
Krüger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.
Sheppard, S.T., et al., "High Power Demonstration at 10 GHz with GaN/AlGaN HEMT Hybrid Amplifiers," 2000 Device Research Conference, Conference Digest, Jun. 2000, pp. 37-38.
Non-Final Office Action for U.S. Appl. No. 13/795,926, mailed Dec. 19, 2014, 14 pages.
Non-Final Office Action for U.S. Appl. No. 13/942,998, mailed Nov. 19, 2014, 9 pages.
Non-Final Office Action for U.S. Appl. No. 13/871,526, mailed Dec. 16, 2014, 17 pages.
Final Office Action for U.S. Appl. No. 13/910,202, mailed Jan. 20, 2015, 10 pages.
Notice of Allowance for U.S. Appl. No. 13/914,060, mailed Nov. 13, 2014, 8 pages.
Final Office Action for U.S. Appl. No. 13/966,400, mailed Dec. 3, 2014, 8 pages.
Final Office Action for U.S. Appl. No. 13/795,986, mailed Dec. 5, 2014, 16 pages.
Author Unknown, "CGHV1J006D: 6 W, 18.0 GHz, GaN HEMT Die," Cree, Inc., 2014, 9 pages.
Notice of Allowance for U.S. Appl. No. 13/795,926, mailed Apr. 27, 2015, 8 pages.
Notice of Allowance for U.S. Appl. No. 13/942,998, mailed Apr. 27, 2015, 8 pages.
Final Office Action for U.S. Appl. No. 13/871,526, mailed Jun. 17, 2015, 11 pages.
Notice of Allowance for U.S. Appl. No. 13/910,202, mailed May 14, 2015, 9 pages.
Corrected/Supplemental Notice of Allowability for U.S. Appl. No. 13/957,689, mailed May 20, 2015, 3 pages.
Corrected/Supplement Notice of Allowability for U.S. Appl. No. 13/957,689, mailed Jun. 9, 2015, 4 pages.
Notice of Allowance for U.S. Appl. No. 13/973,482, mailed May 4, 2015, 7 pages.
Notice of Allowance for U.S. Appl. No. 13/957,698, mailed Jul. 20, 2015, 7 pages.

* cited by examiner

COPIED FROM OKAMOTO

COPIED FROM THE PRESENT APPLICATION

SEMICONDUCTOR DEVICE HAVING IMPROVED HEAT DISSIPATION

RELATED APPLICATIONS

This application claims the benefit of U.S. provisional patent application No. 61/693,076, filed Aug. 24, 2012, the disclosure of which is incorporated herein by reference in its entirety.

FIELD OF THE DISCLOSURE

The present disclosure relates to heat dissipation in semiconductor devices used in power applications.

BACKGROUND

An important property for semiconductor devices used in power applications is thermal resistance, which is a property of a material that is associated with heat conductivity. For example, a material with a high thermal resistance is not a good conductor of heat, whereas a material with a low thermal resistance will conduct heat relatively well. The thermal resistance of certain regions within a semiconductor device will directly determine the maximum heat dissipation of the semiconductor device for a given junction temperature rating. Consequently, it is desirable to minimize the thermal resistance of certain locations within a semiconductor device in order to dissipate heat.

FIG. 1A is a cross-sectional view of a prior art gallium nitride (GaN) high electron mobility transistor (HEMT) 10 depicting a buffer layer 12 between GaN device layers 14 and a semi-insulating substrate 16. The buffer layer 12 and the GaN device layers 14 make up epitaxial layers 18. A source electrode 20, a gate electrode 22 and a drain electrode 24 are disposed onto a surface 26 of the epitaxial layers 18. Heat dissipated in the GaN HEMT 10 must flow through the epitaxial layers 18 to reach the semi-insulating substrate 16, which is selected of a material that provides a relatively low thermal resistivity. For example, the bulk thermal conductivity of GaN is 1.3 W/cm·K compared to a thermal conductivity of around about 3.6 W/cm·K to around about 4.9 W/cm·K for various silicon carbide (SiC) polytypes. Therefore, SiC is a desirable material for the semi-insulating substrate 16. However, due to a lattice mismatch between GaN and common substrates such as SiC, silicon (Si), and Sapphire, a GaN nucleation along with the buffer layer 12 have a high dislocation density, which significantly increases the thermal resistivity of the epitaxial layers 18.

FIG. 1B is a plan view of the prior art GaN HEMT 10 depicting through-wafer vias 28 that are electrically coupled to a bus 30 of the source electrode 20 near the periphery of a die 32. The location of the through-wafer vias 28 prevents the through-wafer vias 28 from efficiently dissipating the heat generated by the GaN HEMT 10 because the largest heat density occurs within a central region of the die 32 in close proximity to drain fingers 34 that are interdigitated with source fingers 36, and gate fingers 38. As a result, there remains a need for a semiconductor device having a structure that dissipates heat with a relatively greater efficiency.

SUMMARY

A semiconductor device having improved heat dissipation is disclosed. The semiconductor device includes a semi-insulating substrate and epitaxial layers disposed on the semi-insulating substrate wherein the epitaxial layers include a plurality of heat conductive vias that are disposed through the epitaxial layers with the plurality of heat conductive vias being spaced along a plurality of finger axes that are aligned generally parallel across a surface of the epitaxial layers. The semiconductor device further includes an electrode having a plurality of electrically conductive fingers that are disposed along the plurality of finger axes such that the electrically conductive fingers are in contact with the first plurality of heat conductive vias. An advantage of the disclosed semiconductor device is that a greater heat density generated within the epitaxial layers is dissipated more efficiently through the plurality of heat conductive vias because they are located where a majority of the heat is generated.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures. Moreover, the term high resistivity and the term semi-insulating are used interchangeably throughout the disclosure. Furthermore, the term semi-insulating refers to being electrically insulating.

Figure 1A:
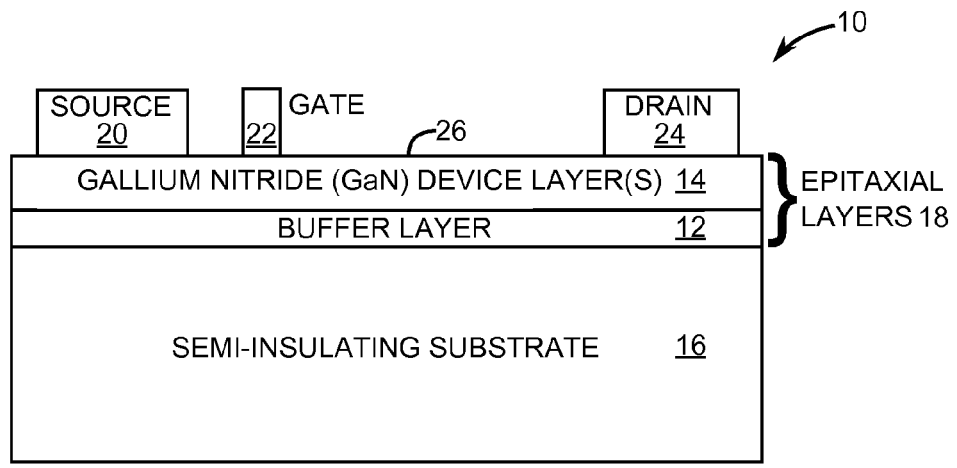
FIG. 1A is a cross-sectional view of a prior art gallium nitride (GaN) high electron mobility transistor (HEMT) depicting a buffer layer between GaN device layers and a semi-insulating substrate.
Figure 1B:
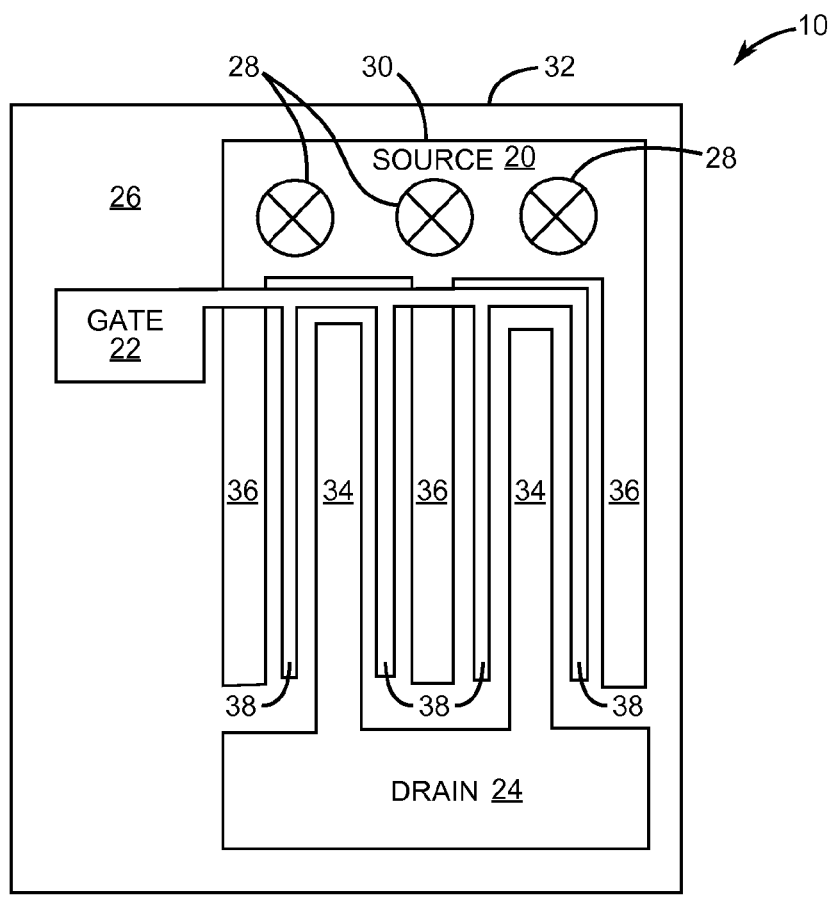
FIG. 1B is a plan view of the prior art GaN HEMT depicting through-wafer vias electrically coupled to a bus of the source electrode near the edge of a die periphery.
Figure 1:
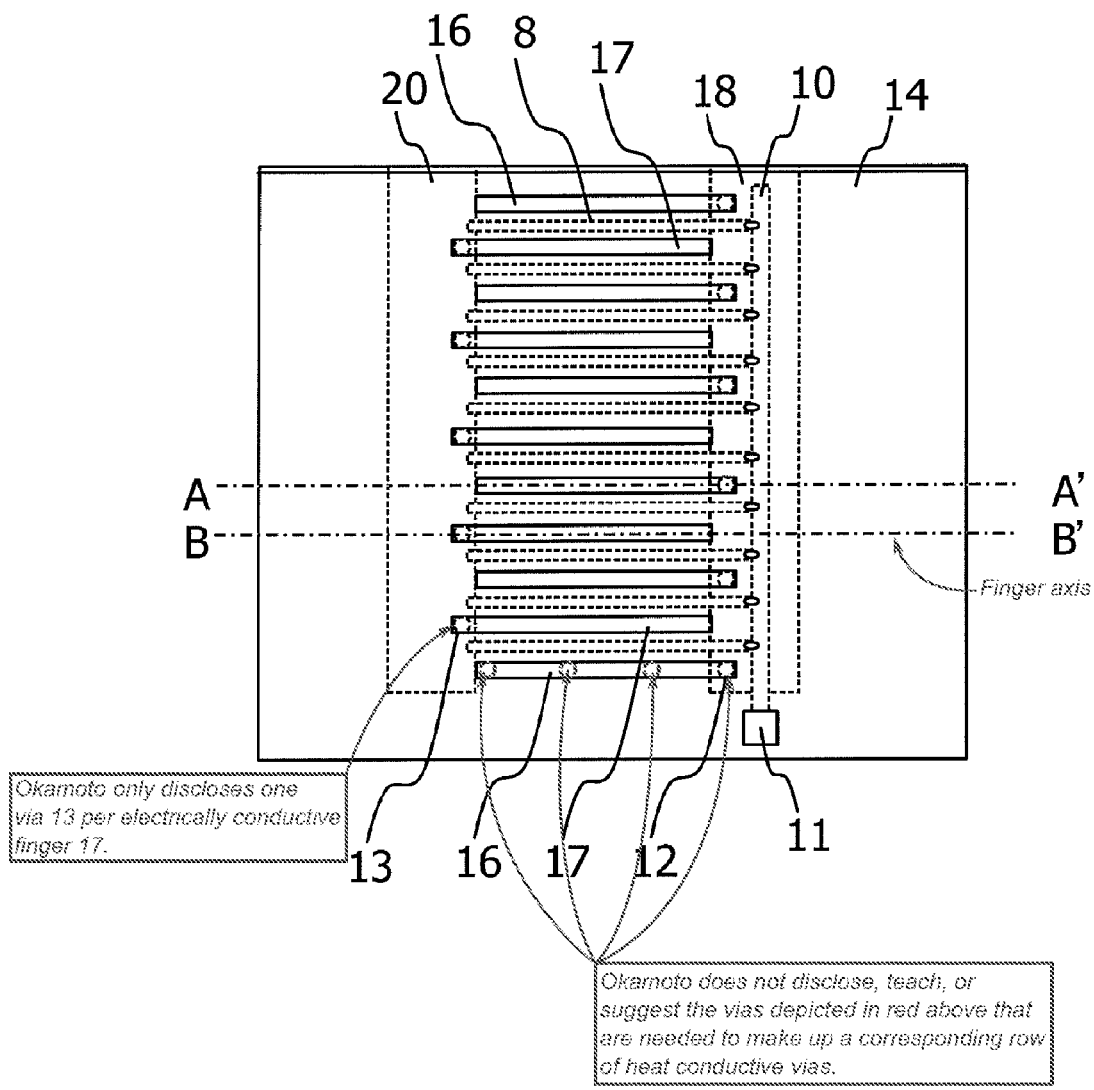
Figure 2A:
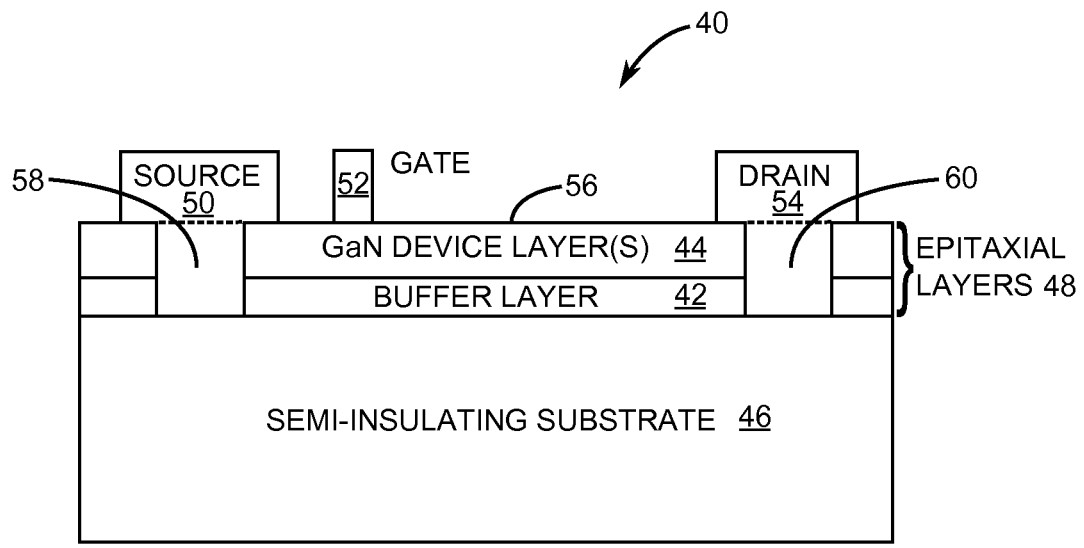
FIG. 2A is a cross-sectional view of an exemplary semiconductor device in the form of a GaN HEMT having heat conductive vias coupled to drain and source electrodes in accordance with the present disclosure.

FIG. 2A is a cross-sectional view of an exemplary semiconductor device 40 in the form of a GaN HEMT with a buffer layer 42 between GaN device layer(s) 44 and a semi-insulating substrate 46. The buffer layer 42 and the GaN device layer(s) 44 make up epitaxial layers 48. A source electrode 50, a gate electrode 52 and a drain electrode 54 are disposed onto a surface 56 of the epitaxial layers 48. FIG. 2A also shows one of a first plurality of heat conductive vias 58 that that are disposed through the epitaxial layers 48 to collectively thermally couple the source electrode 50 to the semi-insulating substrate 46. Similarly, FIG. 2A further shows one of a second plurality of heat conductive vias 60 that are disposed through the epitaxial layers 48 to collectively thermally couple the drain electrode 54 to the semi-insulating substrate 46.

The semi-insulating substrate 46 has a bulk electrical resistivity that ranges from around about $10^7$ ohm-cm to around about $10^{12}$ ohm-cm. As a result of this high bulk resistivity range, no significant electrical current flows through the semi-insulating substrate 46 between the source electrode 50 and the drain electrode 54. Suitable materials for the semi-insulating substrate 46 include, but are not limited to high electrical resistivity silicon carbon (SiC), silicon (Si), gallium nitride (GaN), zinc oxide (ZnO), aluminum oxide ($Al_2O_3$), and gallium oxide ($Ga_2O_3$).

Figure 2B:
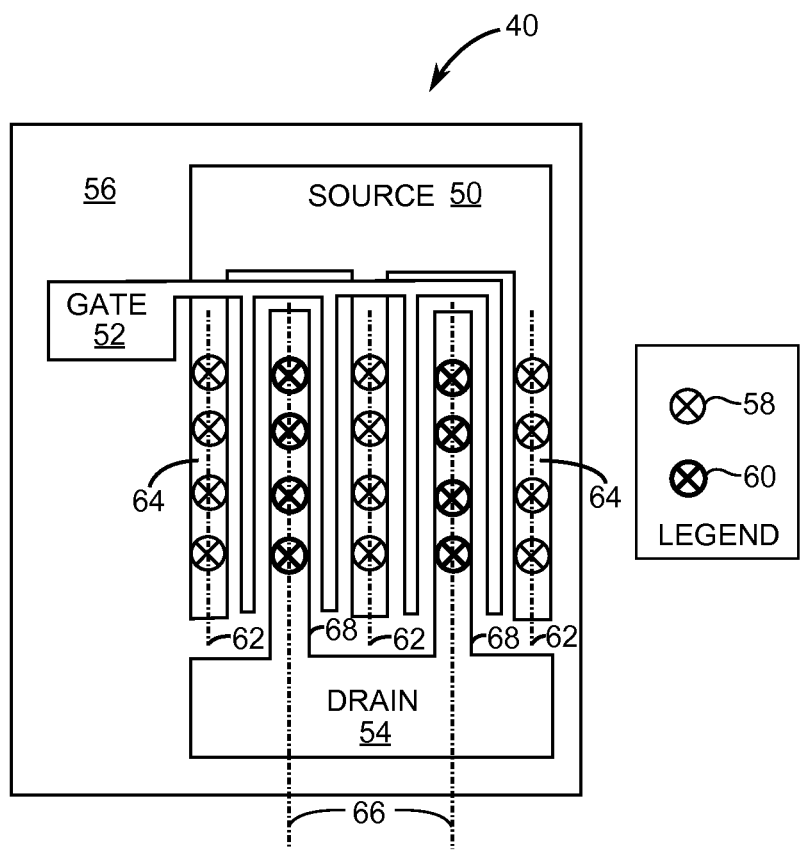
FIG. 2B is a plan view of the GaN HEMT of FIG. 2A showing pluralities of heat conductive vias in contact with drain and source fingers.
Figure 2B:
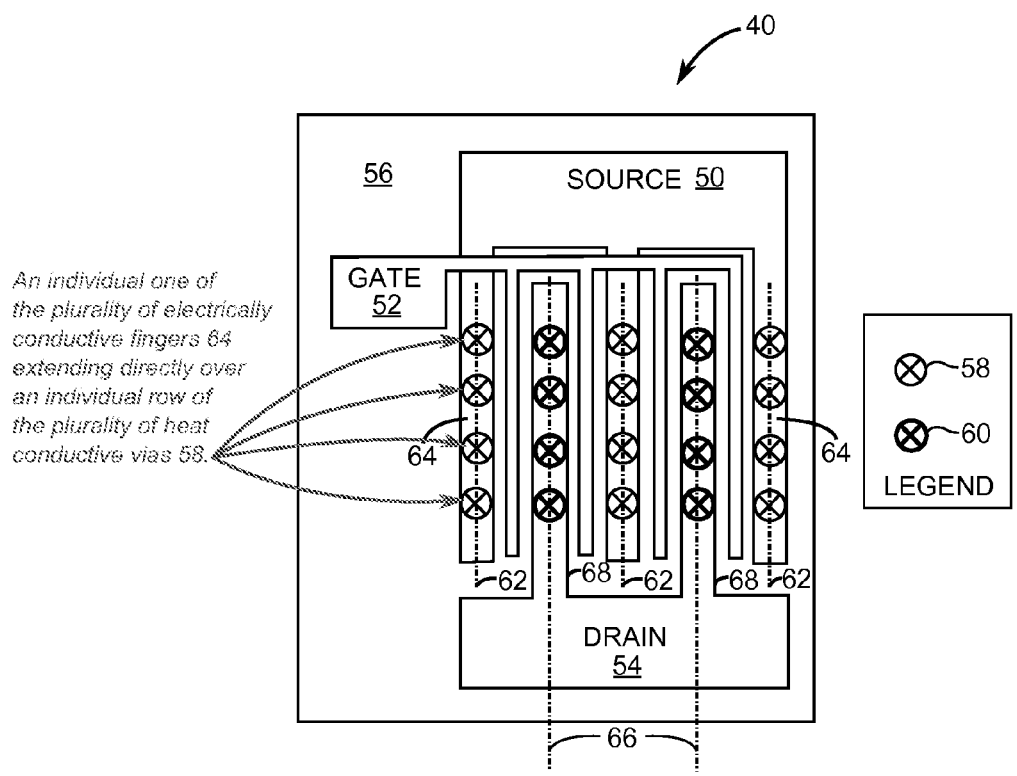

FIG. 2B is a plan view of the semiconductor device 40 of FIG. 2A showing the first plurality of the heat conductive vias 58 being spaced along a first plurality of finger axes 62 that are aligned generally parallel across the surface 56 of the epitaxial layers 48. The source electrode 50 includes a first plurality of electrically conductive fingers 64 that are disposed along the first plurality of finger axes 62 such that the first plurality of electrically conductive fingers 64 are in contact with the first plurality of the heat conductive vias 58. Each of the second plurality of the heat conductive vias 60 are spaced along a second plurality of finger axes 66 that are interdigitated with the first plurality of finger axes 62. The drain electrode 54 includes a second plurality of electrically conductive fingers 68 that are disposed along the second plurality of finger axes 66 such that the second plurality of electrically conductive fingers 68 is in contact with the second plurality of the heat conductive vias 60. Excess heat generated around the first plurality of electrically conductive fingers 64 and the second plurality of electrically conductive fingers 68 is relatively efficiently conducted through the first plurality of the heat conductive vias 58 and the second plurality of the heat conductive vias 60 to the semi-insulating substrate 46 where the excess heat is dissipated.

Figure 3:
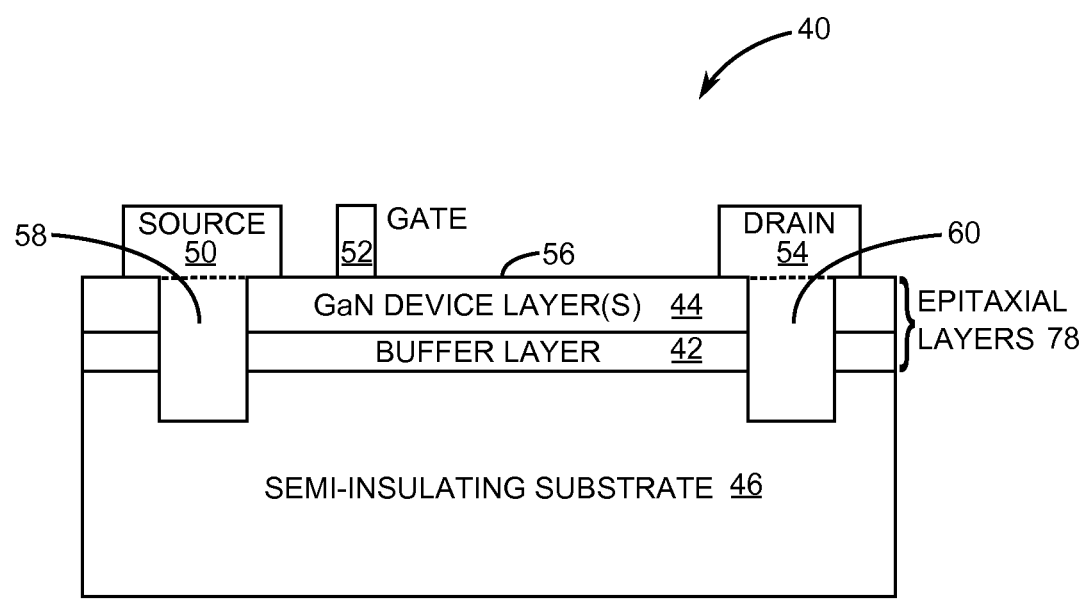
FIG. 3 is a cross-sectional view of an exemplary embodiment of a semiconductor device in the form of a GaN HEMT in which heat conductive vias are further extended into a semi-insulating substrate.

FIG. 3 is a cross-sectional view of an exemplary embodiment of the semiconductor device 40 in which the first plurality of the heat conductive vias 58 and the second plurality of the heat conductive vias 60 are further extended into a semi-insulating substrate 46. By extending the first plurality of the heat conductive vias 58 and the second plurality of the heat conductive vias 60 into the semi-insulating substrate 46, even greater heat dissipation can be realized.

Figure 4A:
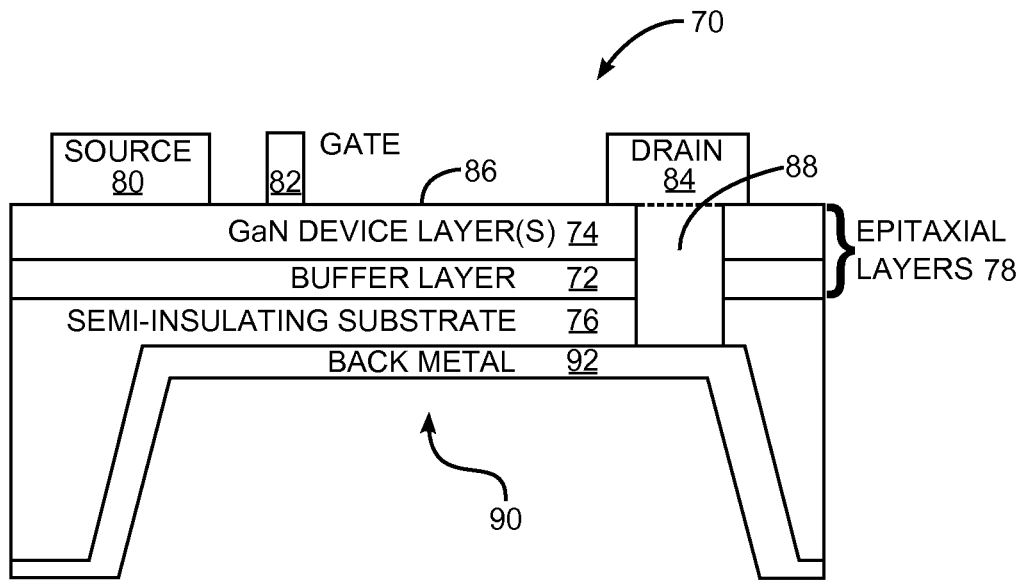
FIG. 4A is a cross-sectional view of an exemplary embodiment of a semiconductor device in the form of a GaN HEMT having through-wafer vias that provide an electrical connection to heat conductive vias.

FIG. 4A is a cross-sectional view of an exemplary semiconductor device 70 in the form of a GaN HEMT with a buffer layer 72 between GaN device layer(s) 74 and a semi-insulating substrate 76. The buffer layer 72 and the GaN device layer(s) 74 make up epitaxial layers 78. A source electrode 80, a gate electrode 82 and a drain electrode 84 are disposed onto a surface 86 of the epitaxial layers 78. FIG. 4A shows one of a plurality of heat conductive vias 88 that are disposed through the epitaxial layers 78 to collectively thermally couple the drain electrode 84 to the semi-insulating substrate 76. In addition, FIG. 4A shows one of a plurality of through hole vias 90 disposed into the semi-insulating substrate 76 to collectively thermally and electrically couple the drain electrode 84 to a back metal 92. Through hole vias 90 are relatively large compared to heat conductive vias 88 therefore direct contact between through hole vias 90 and drain electrode 84 would require relatively wider drain electrodes 84 which would undesirably increase chip size.

Figure 4B:
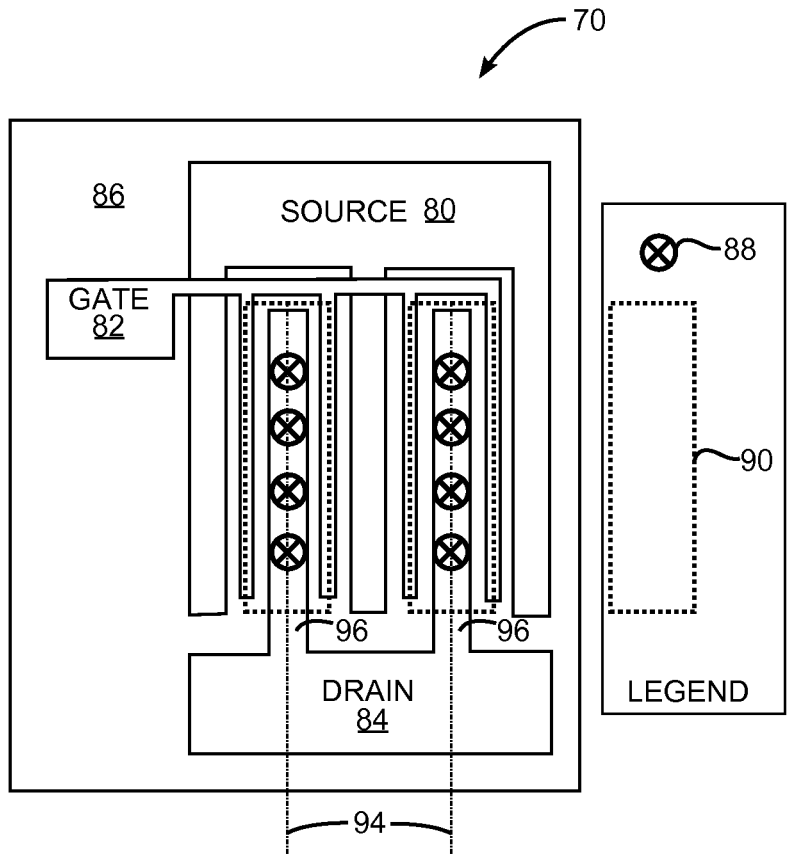
FIG. 4B is a plan view of the GaN HEMT of FIG. 4A showing a plurality of heat conductive vias in contact with drain fingers and the through-wafer vias.

FIG. 4B is a plan view of the semiconductor device 70 of FIG. 4A showing the plurality of the heat conductive vias 88 being spaced along a plurality of finger axes 94 that are aligned generally parallel across the surface 86 of the epitaxial layers 78. The drain electrode 84 includes a plurality of electrically conductive fingers 96 that are disposed along the plurality finger axes 94 such that the plurality of electrically conductive fingers 96 are in contact with the plurality of the heat conductive vias 88. In this exemplary embodiment, each of the plurality of heat conductive vias 88 are filled with an electrically conductive material such as metal. Excess heat generated around the plurality of electrically conductive fingers 96 is relatively efficiently conducted through the plurality of the heat conductive vias 88 to the semi-insulating substrate 76 and the back metal 92 where the excess heat is dissipated. While FIGS. 4A and 4B only show the drain being electrically and thermally coupled to the back metal 92 it is to be understood that the drain and/or source can be routed to the back metal 92 to improve thermal and/or electrical performance while reducing die area by eliminating a need for bond pads (not shown) on the front side of a die.

Those skilled in the art will recognize improvements and modifications to the embodiments of the present disclosure. All such improvements and modifications are considered within the scope of the concepts disclosed herein and the claims that follow.

What is claimed is:

1. A semiconductor device having improved heat dissipation comprising:
    a semi-insulating substrate;
    epitaxial layers disposed on the semi-insulating substrate wherein the epitaxial layers comprise a plurality of heat conductive vias that are disposed through the epitaxial layers with the plurality of heat conductive vias being arranged in rows that are aligned parallel to a plurality of finger axes that are aligned generally parallel across a surface of the epitaxial layers; and
    an electrode having a plurality of electrically conductive fingers that are disposed along the plurality of finger axes such that individual ones of the plurality of electrically conductive fingers extend directly over corresponding rows of the plurality of heat conductive vias and are in contact with the plurality of heat conductive vias.

2. The semiconductor device of claim 1 wherein the plurality of heat conductive vias extend into the semi-insulating substrate.

3. The semiconductor device of claim 1 wherein the epitaxial layers further comprise a second plurality of heat conductive vias that are disposed through the epitaxial layers with the second plurality of heat conductive vias being arranged in rows that are aligned parallel to a second plurality of finger axes that are interdigitated with the plurality of finger axes, and a second electrode having a plurality of electrically conductive fingers that are disposed along the second plurality of finger axes such that individual rows of the second plurality of electrically conductive fingers extend directly over corresponding rows of the second plurality of heat conductive vias and are in contact with the second plurality of heat conductive vias.

4. The semiconductor device of claim 1 wherein the plurality of heat conductive vias are filled with an electrically conductive material.

5. The semiconductor device of claim 4 further including a through-hole via that electrically and thermally couples the plurality of heat conductive vias to a back metal.

6. The semiconductor device of claim 1 wherein the semi-insulating substrate is made of silicon carbide (SiC) polytypes.

7. The semiconductor device of claim 6 where the SiC polytypes have a bulk thermal conductivity that ranges from around about 3.6 W/cm·K to around about 4.9 W/cm·K.

8. The semiconductor device of claim 1 wherein a bulk electrical resistivity of the semi-insulating substrate ranges from around about $10^7$ ohm-cm to around about $10^{12}$ ohm-cm.

9. The semiconductor device of claim 8 wherein material making up the semi-insulating substrate is selected from at least one member of the group consisting of SiC, silicon (Si), gallium nitride (GaN), zinc oxide (ZnO), aluminum oxide ($Al_2O_3$), and gallium oxide ($Ga_2O_3$).

10. The semiconductor device of claim 1 wherein the semiconductor device is a GaN high electron mobility transistor (HEMT).

* * * * *